United States Patent
Yamazawa

(10) Patent No.: US 7,655,110 B2
(45) Date of Patent: *Feb. 2, 2010

(54) PLASMA PROCESSING APPARATUS

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/691,700

(22) Filed: Mar. 27, 2007

(65) Prior Publication Data

US 2007/0227657 A1 Oct. 4, 2007

Related U.S. Application Data

(60) Provisional application No. 60/792,345, filed on Apr. 17, 2006.

(30) Foreign Application Priority Data

Mar. 29, 2006 (JP) .............................. 2006-090243
Mar. 20, 2007 (JP) .............................. 2007-073575

(51) Int. Cl.
C23F 1/00 (2006.01)
H01L 21/306 (2006.01)

(52) U.S. Cl. ............................ 156/345.24; 156/345.25; 156/345.44; 156/345.48

(58) Field of Classification Search ...................... None
See application file for complete search history.

(56) References Cited

U.S. PATENT DOCUMENTS

| 5,099,790 | A | * | 3/1992 | Kawakami | ........... 118/723 MR |
| 5,273,610 | A | * | 12/1993 | Thomas et al. | ......... 156/345.28 |
| 6,878,233 | B2 | | 4/2005 | Hirose | |
| 2006/0145693 | A1 | * | 7/2006 | Buttle et al. | ................ 324/240 |

FOREIGN PATENT DOCUMENTS

JP 2002-43402 2/2002

* cited by examiner

Primary Examiner—Duy-Vu N Deo
(74) Attorney, Agent, or Firm—Oblon, Spivak, McClelland, Maier & Neustadt, L.L.P.

(57) ABSTRACT

In the present invention, a probe which detects a time varying magnetic flux density in a direction around a center axis of a processing space is provided in a process vessel of a plasma processing apparatus. The probe detects an induced electromotive force generated in a coil as the time varying magnetic flux density, and a computer calculates an amount of radio-frequency current in the process vessel from the induced electromotive force, based on a predetermined calculation principle.

19 Claims, 9 Drawing Sheets

PLASMA PROCESSING APPARATUS

CROSS REFERENCE TO RELATED APPLICATIONS

The present invention contains subject matter related to Japanese Patent Application No. 2006-90243, filed on Mar. 29, 2006, Japanese Patent Application No. 2007-073575, filed on Mar. 20, 2007 and Provisional Application No. 60/792,345, filed on Apr. 17, 2006, the entire contents of which being incorporated herein by reference.

BACKGROUND OF THE INVENTION

1. Field of the Invention

The present invention relates to a plasma processing apparatus which processes a substrate by generating plasma in a process vessel.

2. Description of the Related Art

Processing using plasma is widely used in substrate processing such as etching and deposition in manufacturing processes of, for example, semiconductor devices, liquid crystal display devices, and the like.

The plasma processing is usually performed in a plasma processing apparatus. This plasma processing apparatus includes upper and lower electrodes facing each other in a process vessel, and radio-frequency power is supplied to the lower electrode on which, for example, a substrate is placed, to generate plasma between the lower electrode and the upper electrode, thereby processing the substrate.

In the above-described plasma processing, radio-frequency current flows in the plasma from the lower electrode to the upper electrode when the radio-frequency power is supplied. This radio-frequency current contributes to the generation of the plasma, and the state of the plasma such as plasma density, a self-bias (Vdc), and the like is closely correlated with the radio-frequency current. Therefore, the radio-frequency current is an important factor in evaluating the processing state of the substrate. For example, in a case where an amount of the radio-frequency current flowing from the lower electrode to the upper electrode is measured, it is conceivable to attach a current sensor between the lower electrode and a matching circuit, that is, on an output side of the matching circuit. For reference, there has already been disclosed an art in which, in order to detect a degree of peeling (a consumption degree) of the lower electrode ascribable to sputtering, a circuit for measuring current is provided between the lower electrode and a matching circuit, thereby detecting the consumption degree based on the measured value (see Japanese Patent Application Laid-open No. 2002-43402. and U.S. Pat. No. 6,879,233).

SUMMARY OF THE INVENTION

However, in a case where the current sensor is provided on the output side of the matching unit as described above, a measurement point of the amount of the radio-frequency current is distant from the plasma and power is consumed due to the influence of impedance of the process vessel, and consequently, a current amount measured by the current sensor is different from an amount of the radio-frequency current actually passing through the plasma. This has made it difficult to correctly evaluate the processing state of the substrate from the measured amount of the radio-frequency current. In particular, in a case of a radio-frequency wave of about several tens MHz used for an etching process, an amount of the current at the measurement point on the output side of the aforesaid matching unit becomes often greatly different from an amount of the current actually entering the plasma, and in this case, it has not been possible to correctly know the processing state of the substrate.

In recent years, further scale-down of design rule has created a demand for strict adjustment of a power value of radio-frequency power applied to an electrode, in order to cope with a demand for uniformity in CD (Critical Dimension) of etching results, etching of a resist film with poor plasma resistance such as an ArF resist, and the like.

However, ceramic insulators or the like, which have been used in plasma processing apparatuses, are individually different in power loss of the radio-frequency power, and therefore, when the same processing is performed in a plurality of the same plasma processing apparatuses, there is a possibility that processing results differ among the apparatuses (machine difference) even if, for example, a power value of the radio-frequency power is strictly adjusted.

The present invention was made in view of the above respect, and an object thereof is to more correctly detect an amount of radio-frequency current passing in plasma in a process vessel. It is another object of the present invention to reduce difference in processing result among a plurality of the same plasma processing apparatuses when the same processing is performed in the apparatuses.

To attain the above object, the present invention is a plasma processing apparatus which has upper and lower radio-frequency electrodes facing each other in a process vessel and processes a substrate by supplying radio-frequency power to at least one of the radio-frequency electrodes and generating plasma in the process vessel, the apparatus including: a probe which is disposed in the process vessel to detect a time varying magnetic flux density directed in a azimuthal direction around an up/down-direction center axis of the process vessel; and a calculation part which calculates an amount of radio-frequency current passing in the plasma when the radio-frequency power is supplied, based on the time varying magnetic flux density detected by the probe.

According to the present invention, the time varying magnetic flux density actually generated in the direction around the center axis of the process vessel is detected, and the amount of the radio-frequency current can be calculated from the time varying magnetic flux density. This enables correct detection of the amount of the radio-frequency current passing in the plasma in the process vessel. Therefore, it is possible to correctly evaluate the processing state of, for example, a substrate.

The probe in the above-described plasma processing apparatus may be formed in a coil shape, and an axis of the coil may be directed in the azimuthal direction around the center axis of the process vessel. Further, this probe may detect an induced electromotive force generated in the coil, as the time varying magnetic flux density, and the calculation part may calculate the amount of the radio-frequency current from the induced electromotive force.

Further, the probe of the above-described plasma processing apparatus may be provided at a height between the upper and lower radio-frequency electrodes.

The probe of the above-described plasma processing apparatus may be provided at a substantially same height as the substrate held on one of the upper and lower radio-frequency electrodes in the process vessel.

The probe of the above-described plasma processing apparatus may be provided on an outer side of the substrate held on one of the upper and lower radio-frequency electrodes in the process vessel. This probe may be provided at a position apart from a sidewall portion of the process vessel by 15 mm to 25 mm.

The probe of the above-described plasma processing apparatus may be covered by an insulative cover.

The probe of the above-described plasma processing apparatus may be buried in a member facing the generated plasma. This probe may be buried in a wall portion of the process vessel. Further, the probe may be buried in an annular member surrounding an outer periphery of the substrate held on one of the upper and lower radio-frequency electrodes in the process vessel.

The probe of the above-described plasma processing apparatus may be movable up and down in the process vessel.

The above-described plasma processing apparatus may further include a control part which executes the detection of the time varying magnetic flux density and the calculation of the amount of the radio-frequency current during the processing of the substrate, and stops the processing of the substrate based on the calculated amount of the radio-frequency current and a preset threshold value of the amount of the radio-frequency current.

The above-described plasma processing apparatus may further include an adjustment part which adjusts an output of the radio-frequency power based on the calculated amount of the radio-frequency current.

The above-described plasma processing apparatus may further include an analysis part which decomposes the detected time varying magnetic flux density into frequency components included in the detected time varying magnetic flux density.

The present invention according to another aspect is a plasma processing apparatus which has upper and lower radio-frequency electrodes facing each other in a process vessel and processes a substrate by supplying radio-frequency power to at least one of the radio-frequency electrodes and generating plasma in the process vessel, the apparatus including: a detecting part detecting an amount of radio-frequency current supplied to the process vessel by the supply of the radio-frequency power; and a control part controlling the radio-frequency power to make the amount of the radio-frequency current detected by the detecting part constant.

The detecting part of the plasma processing apparatus may be a probe disposed in the process vessel.

The plasma processing apparatus may further include a radio-frequency power source supplying the radio-frequency power to the radio-frequency electrode, and the detecting part may be disposed on an output side of the radio-frequency power source.

The plasma processing apparatus may further include: a radio-frequency power source supplying the radio-frequency power to the radio-frequency electrode; and a matching unit provided between the radio-frequency electrode and the radio-frequency power source, and the detecting part may be disposed on an output side of the matching unit.

The present invention according to still another aspect is a plasma processing apparatus which has upper and lower radio-frequency electrodes facing each other in a process vessel and processes a substrate by supplying radio-frequency power to at least one of the radio-frequency electrodes and generating plasma in the process vessel, the apparatus including a setting storage part storing in advance a plurality of set values to perform the plasma processing, wherein the setting storage part has a value of an amount of radio-frequency current as the set value.

According to the present invention, since an amount of radio-frequency current passing in generated plasma can be accurately detected, it is possible to more correctly know the processing state of a substrate from the detected amount of the radio-frequency current.

DETAILED DESCRIPTION OF THE PREFERRED EMBODIMENT

Figure 1:
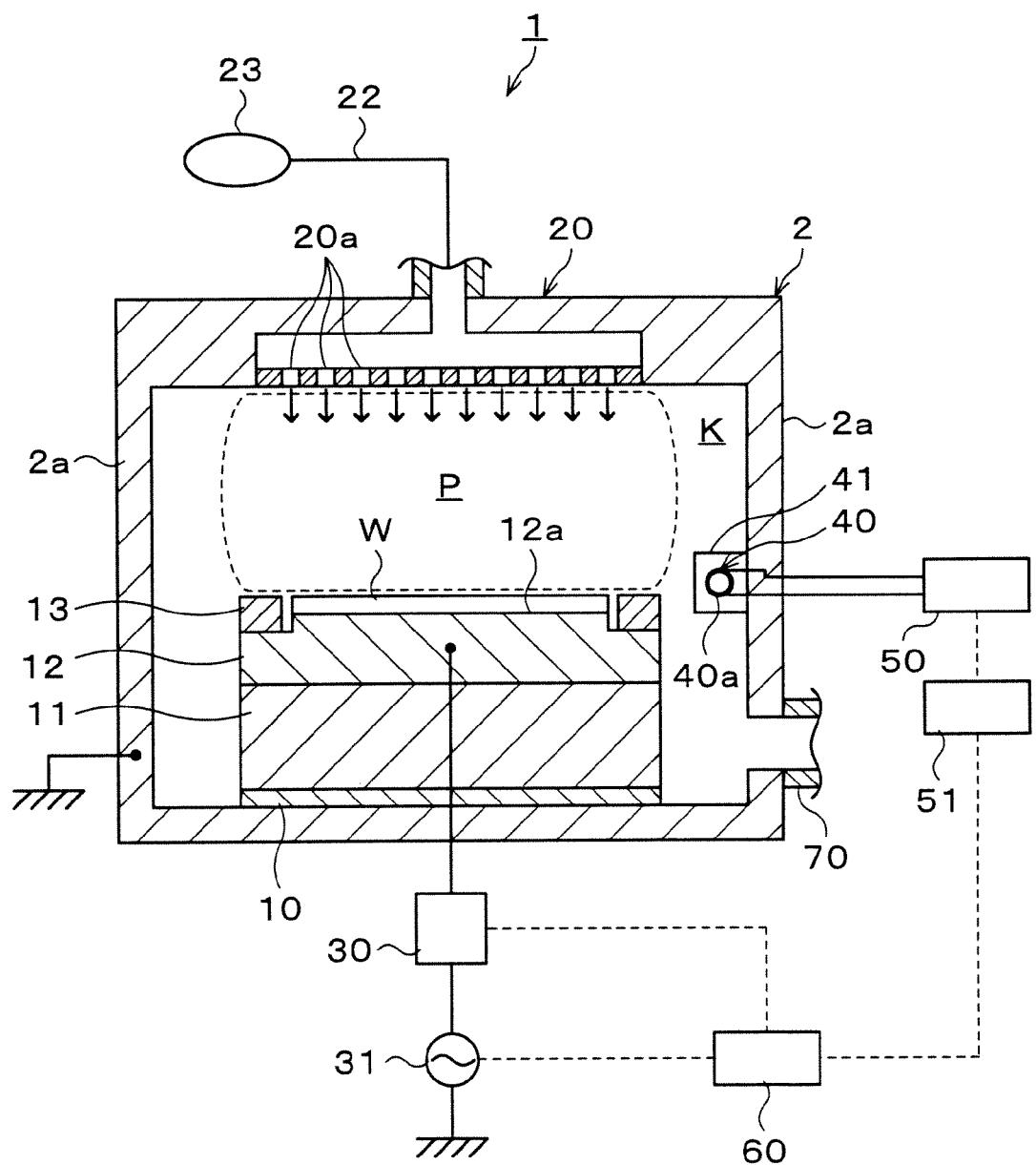
FIG. 1 is an explanatory vertical cross-sectional view roughly showing the structure of a plasma etching apparatus according to this embodiment.

Hereinafter, a preferred embodiment of the present invention will be described. FIG. 1 is an explanatory vertical cross-sectional view roughly showing the structure of a plasma etching apparatus 1 as a plasma processing apparatus according to the present invention. In the present specification and the drawings, constituent elements having substantially the same functional structure are denoted by the same reference numerals and symbols, and thus repeated description thereof will be omitted.

As shown in FIG. 1, the plasma etching apparatus 1 includes a process vessel 2 in, for example, a substantially cylindrical shape. A processing space K is formed in the process vessel 2. The process vessel 2 is grounded.

For example, on a bottom portion of a center portion of the process vessel 2, a columnar electrode support table 11 is provided via an insulation plate 10. On the electrode support table 11, provided is a lower electrode 12 as a radio-frequency electrode serving also as a mounting table for placing a substrate W thereon. A center portion of an upper surface of the lower electrode 12 protrudes in a columnar shape, and the substrate W is held on this protruding portion 12a. The protruding portion 12a is an electrostatic chuck. Around the protruding portion 12a of the lower electrode 12, a focus ring 13 as an annular member which is made of quartz and formed in a ring shape is provided.

On a ceiling portion, of the process vessel 2, facing the lower electrode 12, an upper electrode 20 in, for example, a substantially disk shape is attached. In a lower surface of the upper electrode 20, for example, a large number of gas jetting ports 20a are formed. The gas jetting ports 20a communicate with a gas supply source 23 via a gas supply pipe 22 connected to an upper surface of the upper electrode 20. In the gas supply source 23, process gas for an etching process is stored, and the process gas led through the gas supply pipe 22 into the upper electrode 20 is supplied to the processing space K through the plural gas jetting ports 20a.

A radio-frequency power source 31 is electrically connected to the lower electrode 12 via a matching unit 30. The radio-frequency power source 31 is capable of outputting radio-frequency power with, for example, 40 MHz frequency or higher, for example, with a 60 MHz frequency. The matching unit 30 is capable of controlling impedance to, for example a fundamental, harmonics, and the like of the radio-frequency power. Incidentally, the operations of the radio-frequency power source 31 and the matching unit 30 are controlled by a later-described control part 60.

Figure 2:
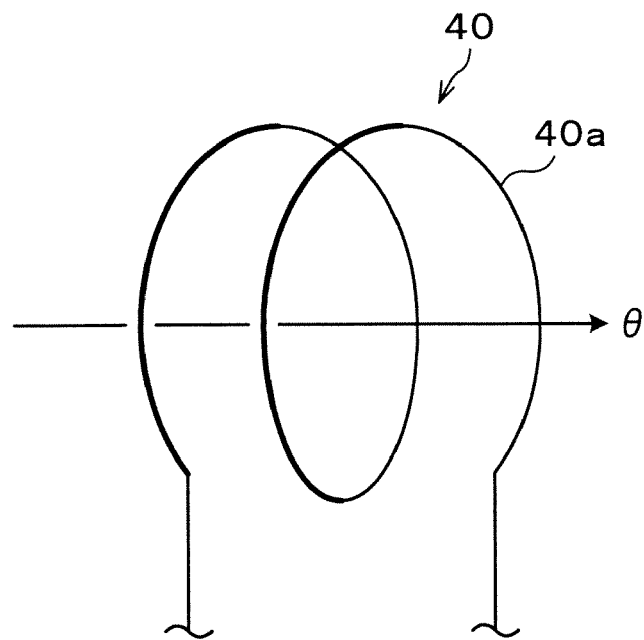
FIG. 2 is a schematic view of a coil of a probe.

Near a sidewall portion 2a of the process vessel 2, a probe 40 is disposed. The probe 40 is constituted of a double-wound circular coil 40a with an about 3 mm diameter, as shown in, for example, in FIG. 2. An axis of the coil 40a is directed in a azimuthal direction θ around an up/down-direction center axis of the process vessel 2. In other words, the coil 40a is disposed, with a coil face making a right angle relative to both of a surface of the substrate W on the lower electrode 12 and an inner surface of the sidewall portion 2a of the process vessel 2, as shown in FIG. 1. With this structure, a magnetic flux in the azimuthal direction θ generated in the processing space K penetrates the inside of the coil 40a, and the probe 40 can detect an induced electromotive force, which is induced in the coil 40a by a change in the magnetic flux, as a time varying magnetic flux density in the azimuthal direction θ.

Figure 3:
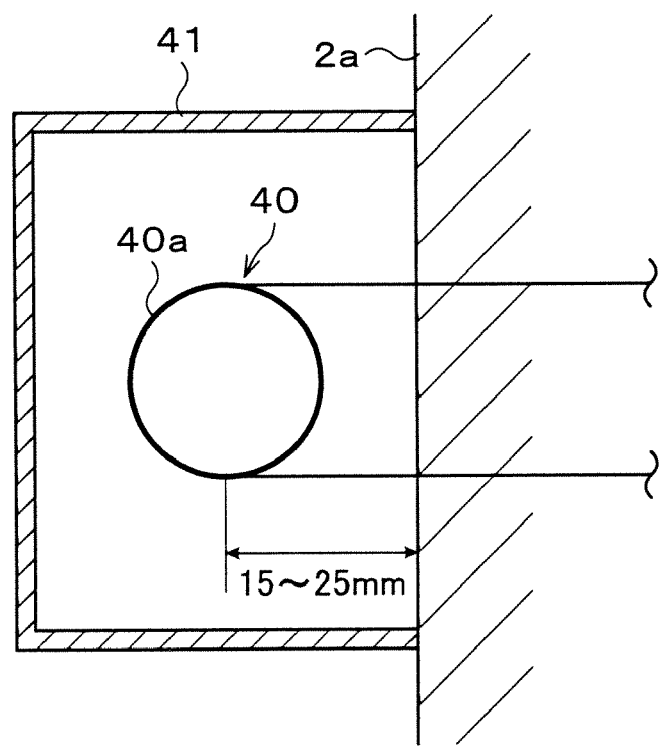
FIG. 3 is an explanatory view showing an installation position of the probe.

The probe 40 is disposed at a position which is, for example, an outer side of the substrate W placed on the lower electrode 12 and a substantially same height as the substrate W. For example, the probe 40 is positioned so that a lower end portion of the coil 40a is 5 mm to 10 mm higher than the surface of the substrate W. Further, the probe 40 is disposed near the sidewall portion 2a at a position apart from the inner surface of the sidewall portion 2a by 15 mm to 25 mm, more preferably 20 mm, as shown in FIG. 3. The probe 40 is covered by an insulative cover 41 of, for example, quartz or ceramics which is fixed on the sidewall portion 2a.

As shown in FIG. 1, the coil 40a of the probe 40 is connected to an analyzer box 50 as an analysis part. The analyzer box 50 is capable of decomposing the time varying magnetic flux density (induced electromotive force) detected by the probe 40, into frequency components included therein.

The analyzer box 50 is connected to a computer 51 as a calculation part. The computer 51 calculates an amount of radio-frequency current passing in the plasma in the processing space K, from the induced electromotive force of each of the frequency components resulting from the decomposition by the analyzer box 50, based on a later-described calculation principle, and is capable of storing information of the calculated amounts. The amount of the radio-frequency current mentioned here is a total amount of the current passing in a plasma area P.

Figure 4:
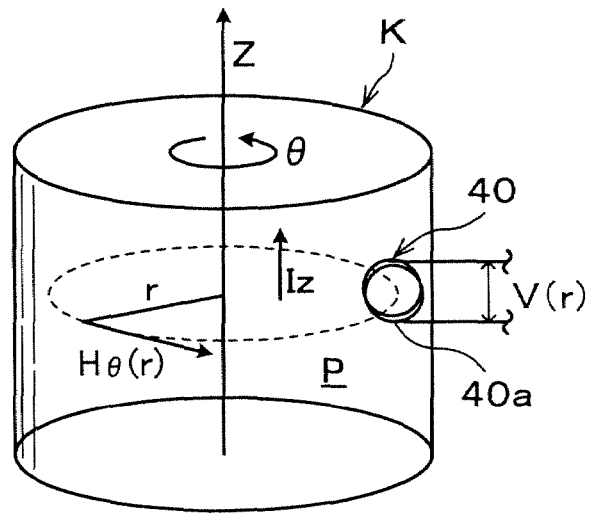
FIG. 4 is a schematic view of a processing space where an amount of radio-frequency current is calculated.

Here, the calculation principle of a radio-frequency current amount Az of a radio-frequency current Iz will be described by using FIG. 4. FIG. 4 schematically shows the inside of the process vessel 2 having the plasma area P. In FIG. 4, r is the distance from the center axis of the process vessel 2, $H_\theta(r)$ is the intensity of the magnetic field in the azimuthal direction θ, and V(r) is the induced electromotive force generated in the coil 40a. The radio-frequency current Iz is expressed by the following expression (1) by using the radio-frequency current amount Az.

$$I_z = A_z \cos(\omega t) \tag{1}$$

According to the Ampere's rule, the following expression (2) holds.

$$\oint H_\theta(r)ds = I_z \tag{2}$$
$$H_\theta(r) = \frac{1}{2\pi r}I_z$$

Further, according to the Faraday's law, the following expression (3) holds, $$V(r) = -\frac{d\Phi}{dt} \tag{3}$$

where φ is the magnetic flux. If the expressions (1), (2) are substituted in the expression (3) for transformation, then, $$V(r) = -\frac{d\Phi}{dt}$$
$$= -N\mu_0 S \frac{d}{dt} H_\theta(r)$$
$$= N\mu_0 S \frac{\omega}{2\pi r} A_z$$

where N is a number of windings of the coil 40a, S is an area of the coil face, and $\mu_0$ is magnetic permeability. Therefore, $$A_z = \frac{2\pi r}{N\mu_0 S\omega}V(r) \tag{4}$$

and thus, the radio-frequency current amount Az is calculated from the induced electromotive force V(r) generated in the coil 40a.

The computer 51 is capable of outputting the stored information of the calculated radio-frequency current amount Az to the control part 60 of the plasma etching apparatus 1 shown in FIG. 1. For example, the control part 60 compares the outputted radio-frequency current amount Az with a preset threshold value, and if a value of the radio-frequency current amount Az exceeds the threshold value, the control part 60 can stop the processing of the substrate W by outputting an error.

As shown in FIG. 1, an exhaust pipe 70 communicating with an exhaust mechanism (not shown) is connected to a lower portion of the process vessel 2. By vacuuming the inside of the process vessel 2 via the exhaust pipe 70, it is possible to reduce the pressure of the processing space K to a predetermined pressure.

Next, the operation of the plasma etching apparatus 1 as structured above will be described.

When the etching process is performed in the plasma etching apparatus 1, the substrate W is first carried into the process vessel 2 to be placed on the lower electrode 12 as shown in FIG. 1. By the exhaust through the exhaust pipe 70, the pressure in the process vessel 2 is reduced, and predetermined process gas is supplied through the gas jetting ports 20a. Next, the radio-frequency power source 31 supplies the radio-frequency power for plasma generation to the lower electrode 12. Consequently, radio-frequency voltage is applied between the lower electrode 12 and the upper electrode 20, the plasma is generated in the processing space K between the lower electrode 12 and the upper electrode 20 in the process vessel 2, and the plasma area P is formed. By this plasma, active species, ions, and so on are generated from the process gas and a surface film of the substrate W is etched. After the etching for a predetermined time, the supply of the radio-frequency power and the supply of the process gas are stopped, and the substrate W is carried out of the process vessel 2, whereby a series of the etching processes is finished.

In the plasma etching apparatus 1, to detect the radio-frequency current amount Az passing in the plasma area P, a time varying magnetic flux density in the azimuthal direction θ of the processing space K is first detected by the probe 40 during the generation of the plasma. At this time, the magnetic flux φ in the azimuthal direction θ of the processing space K passes in the coil 40a of the probe 40, and the induced electromotive force V(r) is generated in the coil 40a due to the change in the magnetic flux φ in the coil 40a. The probe 40 detects the induced electromotive force V(r) as the time varying magnetic flux density. Detection information of the induced electromotive force V(r) is inputted to the analyzer box 50, and the analyzer box 50 decomposes the detected induced electromotive force V(r) into frequency components such as the fundamental, harmonics, and the like of the radio-frequency power. The induced electromotive force V(r) decomposed into the frequency components is sent to the computer 51, and the computer 51 calculates the radio-frequency current amount Az by using the calculation principle such as the aforesaid expression (4) and so on.

The calculated radio-frequency current amount Az is outputted to, for example, the control part 60, where the radio-frequency current amount Az is compared with, for example, the preset threshold value for each of the frequency components. The radio-frequency current amount Az, if equal to or smaller than the threshold value, is judged as normal. If the radio-frequency current amount Az exceeds the threshold value, for example, an error is outputted to stop the processing of the substrate. Further, the information of the radio-frequency current amount Az is stored in the control part 60 to be used as information for evaluating the processing state of the substrate W.

According to the above-described embodiment, since the probe 40 is disposed in the process vessel 2, it is possible to directly detect the radio-frequency current amount Az passing in the plasma. This enables more correct detection of the radio-frequency current amount Az, and based on this radio-frequency current amount Az, it is possible to more correctly evaluate, for example, the processing state of the substrate W.

Further, the probe 40 is formed in a coil shape and the axis of the coil 40a is directed in the azimuthal direction θ of the processing space K, and therefore, by making the magnetic flux φ penetrate the inside of the coil 40a to generate the induced electromotive force in the coil 40a by electromagnetic induction, it is possible to detect the time varying magnetic flux density in the azimuthal direction θ as the induced electromotive force V(r).

Since the probe 40 is covered by the insulative cover 41 made of quartz or ceramics, it is possible to prevent the corrosion of the probe 40 caused by the plasma.

Since the probe 40 is disposed at a position which is the outer side of the substrate W and near the sidewall portion 2a, the probe 40 does not interfere with the processing of the substrate W in the processing space K, which enables the proper processing of the substrate W.

Figure 5:
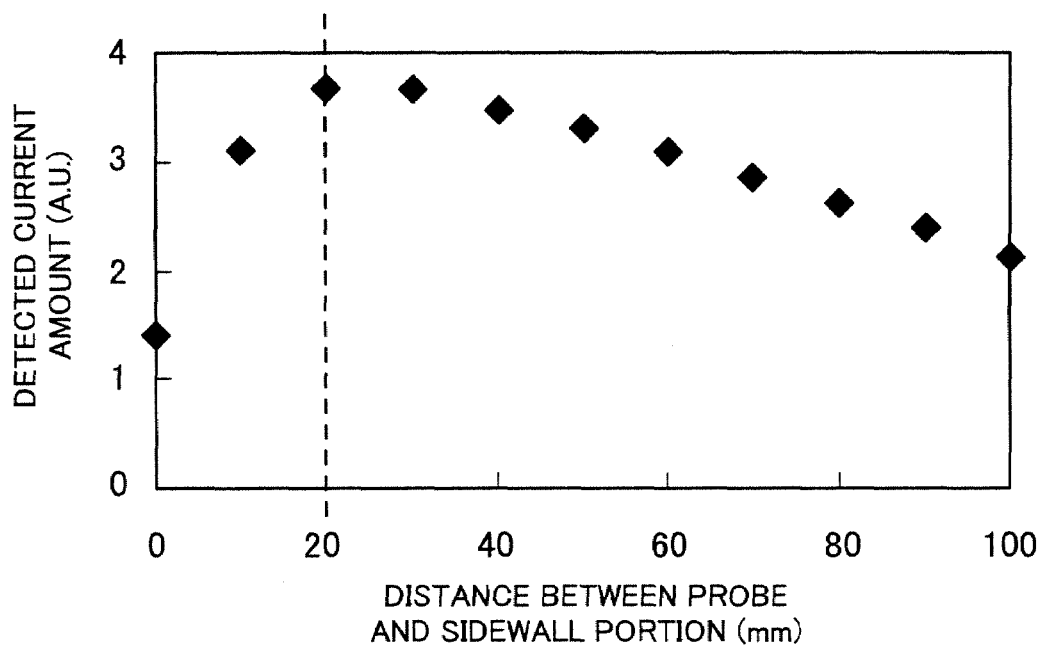
FIG. 5 is a graph showing the correlation between the distance from the probe to a sidewall portion and a detected amount of current at this position.

Further, the probe 40 is provided at the position apart from the inner surface of the sidewall portion 2a of the process vessel 2 by 15 mm to 25 mm. FIG. 5 is a graph showing a current amount detected by the probe 40, with the distance between the probe 40 and the sidewall portion 2a being varied and with other conditions being the same. From the graph in FIG. 5, it is apparent that the detected current amount is high when the probe 40 is 15 mm to 25 mm distant from the sidewall portion 2a. Therefore, by positioning the probe 40 within an area 15 mm to 25 mm distant from the sidewall portion 2a, it is possible to make sensitivity of the probe 40 optimum.

Further, in the above-described embodiment, since the probe 40 is disposed at substantially the same height as the substrate W, the radio-frequency current amount Az near the surface of the substrate W, which most influences the etching process, can be detected.

In the above-described embodiment, since the control part 60 stops the processing of the substrate W when the radio-frequency current amount Az exceeds the threshold value, it is possible to quickly cope with an abnormal processing state of the substrate W, which makes it possible to prevent the manufacture of a large quantity of defective substrates W.

Since the analyzer box 50 decomposes the induced electromotive force V(r) outputted from the probe 40 into the frequency components such as the fundamental, harmonics, and so on of the radio-frequency power, it is possible for the computer 51 to finally calculate the radio-frequency current amount Az for each of the frequency components. This makes it possible to know the state of the plasma in the processing space K in more detail to evaluate the state of the processing of the substrate W.

Incidentally, the impedance to the fundamental and harmonics in a circuit of the lower electrode 12 side may be controlled based on the radio-frequency current amounts of the fundamental and harmonics resulting from the decomposition by the analyzer box 50. In this case, for example, the control part 60 controls the impedance of the fundamental and harmonics by using the matching unit 30, based on the calculated radio-frequency current amounts Az of the fundamental and harmonics. This makes it possible to control the fundamental component and harmonic components of the radio-frequency current in the plasma and to properly adjust the state of the plasma and the processing state of the substrate W.

The control part 60 described in the above embodiment may adjust the output of the radio-frequency power source 31 based on, for example, the inputted radio-frequency current amount Az. In this case, the control part 60 functions as an adjustment part. The radio-frequency current amount AZ may be returned to a value within a tolerable range by, for example, increasing the output of the radio-frequency power source when the radio-frequency current amount Az becomes less than a set value, and by decreasing the output of the radio-frequency power source 31 when the radio-frequency current amount Az becomes more than the set value. This enables the processing of the substrate W in a fixed state of the plasma.

Figure 6:
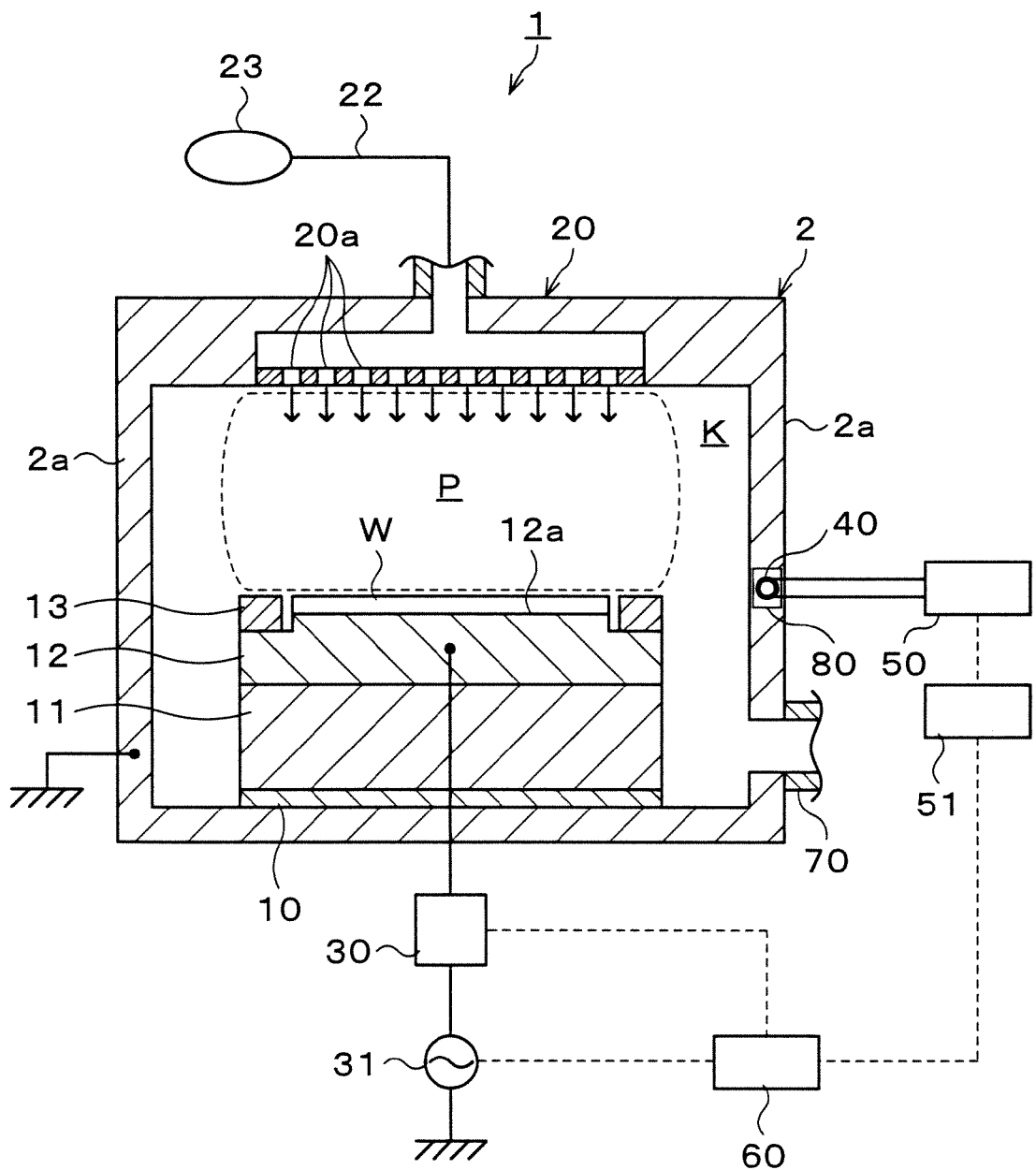
FIG. 6 is an explanatory vertical cross-sectional view roughly showing the structure of a plasma etching apparatus in which a probe is provided in a sidewall portion.

In the above-described embodiment, the probe 40 is attached to the sidewall portion 2a of the process vessel 2, but the probe 40 may be buried in the sidewall portion 2a as shown in FIG. 6. In this case, a space 80 is formed in, for example, the sidewall portion 2a, and the probe 40 is disposed in the space 80. With this structure, since the probe 40 does not protrude to the processing space K in the process vessel 2, the plasma in the processing space K is not affected by the probe 40. Further, since the probe 40 is protected by the sidewall portion 2*a*, the corrosion of the probe 40 caused by the plasma can also be prevented. Incidentally, in this case, a current amount detected by the probe 40 may possibly decrease as shown in FIG. 5 described above, and therefore, in this case, an amount of this decrease may be taken into consideration in advance in evaluating the radio-frequency current amount Az.

Figure 7:
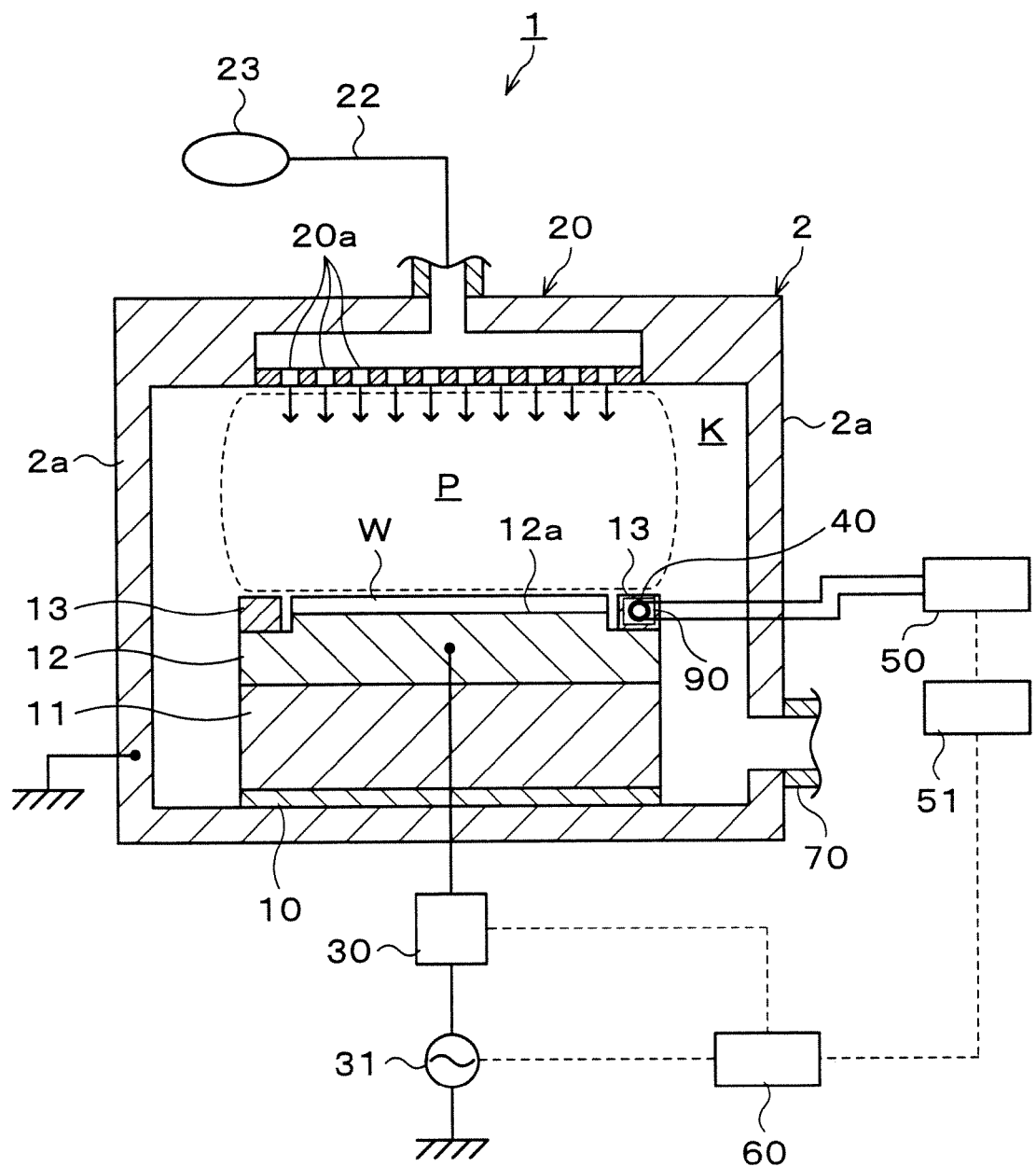
FIG. 7 is an explanatory vertical cross-sectional view roughly showing the structure of a plasma etching apparatus in which a probe is provided in a focus ring.

Further, if a material of the focus ring 13 is a dielectric, the probe 40 may be buried in the focus ring 13 provided around the substrate W, as shown in FIG. 7. In such a case, a space 90 is formed in, for example, the focus ring 13, and the probe 40 is disposed in the space 90. Also in this case, the probe 40 does not protrude into the processing space K in the process vessel 2, and thus does not affect the plasma in the processing space K. Further, since the probe 40 is protected by the focus ring 13, the corrosion of the probe 40 caused by the plasma can also be prevented. Further, since the position of the probe 40 is close to the surface of the substrate W, the state of the plasma immediately above the substrate W, which most influences the etching process, can be more correctly detected.

A place in which the probe 40 is buried is not limited to the sidewall portion 2*a* or the focus ring 13, but the probe 40 may be buried in another dielectric member facing the plasma area P, such as a window portion (not shown) through which the inside of the process vessel 2 is seen or the upper electrode 20.

Figure 8:
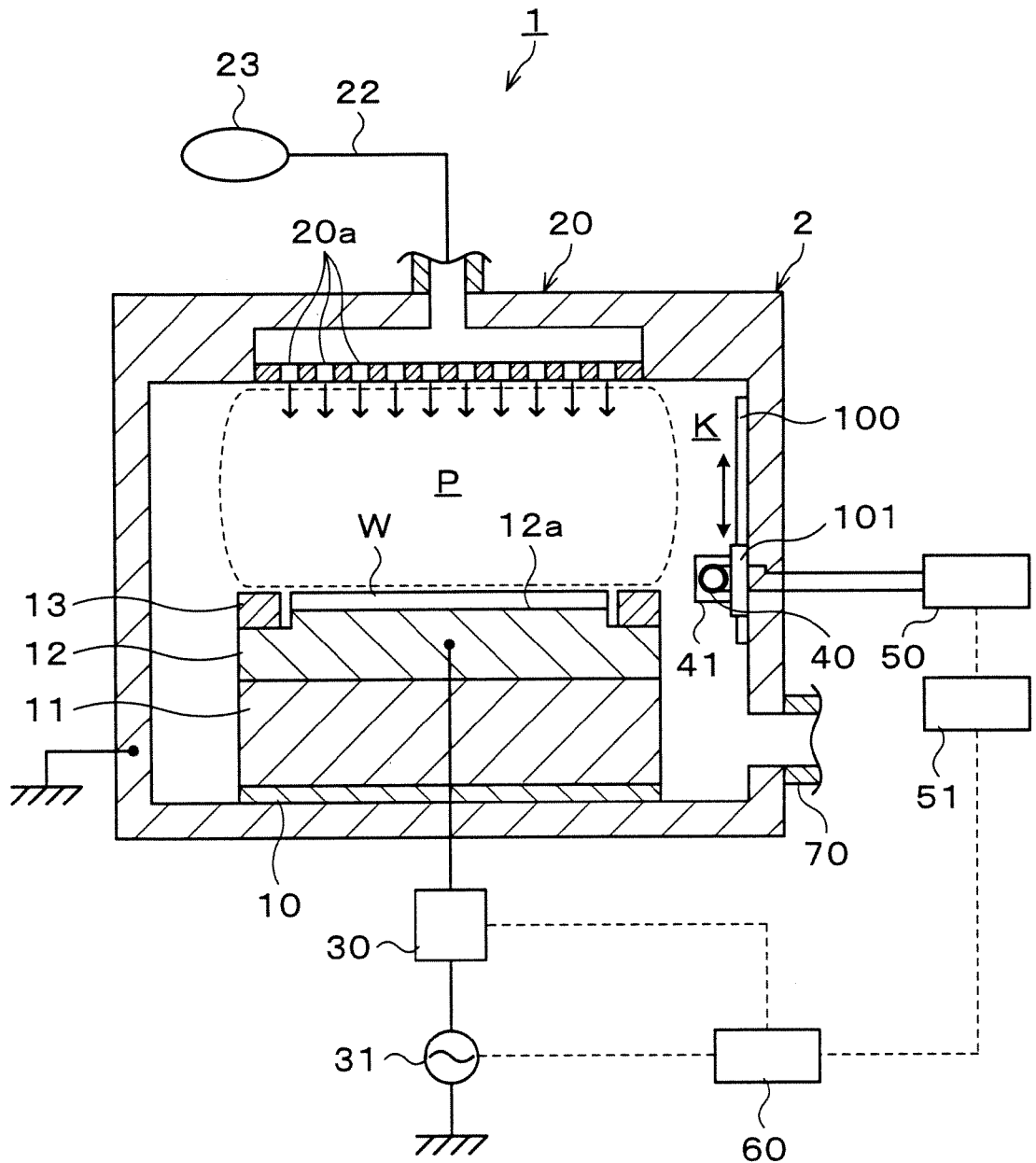
FIG. 8 is an explanatory vertical cross-sectional view roughly showing the structure of a plasma etching apparatus in which a probe is movable up and down.

In the above-described embodiment, the probe 40 is fixed on the sidewall portion 2*a*, but the probe 40 may be movable in the up/down direction. For example, as shown in FIG. 8, the probe 40 and its cover 41 may be attached on a slider 101 moving along a rail 100 which is provided on the sidewall portion 2*a* of the process vessel 2 to extend in the up/down direction. To detect the radio-frequency current amount Az, the probe 40 is moved up and down to detect the time varying magnetic flux density at a plurality of positions in the up/down direction. Consequently, for example, it is possible to know the up/down-direction distribution of the radio-frequency current amount Az in the plasma area P. For example, the radio-frequency current amounts Az at two upper and lower positions are compared, and if the radio-frequency current amount Az on the upper side is smaller, it can be confirmed that the radio-frequency current Iz is flowing out between the two detection positions. In this manner, it is possible to know the flow of the radio-frequency current Iz in the plasma area P, so that useful information for evaluating the state of the plasma can be obtained.

In the above-described embodiment, the control part 60 may control the radio-frequency power applied to the electrode so as to make an amount of the radio-frequency current detected by a detecting part constant. In such a case, the radio-frequency current amount Az detected by, for example, the probe 40 is outputted to the control part 60 as describe above, and the control part 60 controls the output of the radio-frequency power source 31 so that the radio-frequency current amount Az has a preset fixed value. Consequently, for example, in a case where the same processing is performed in a plurality of the same plasma etching apparatuses 1, the same result can be obtained in the apparatuses, and therefore, it is possible to reduce difference in the processing result among the apparatuses.

Figure 9:
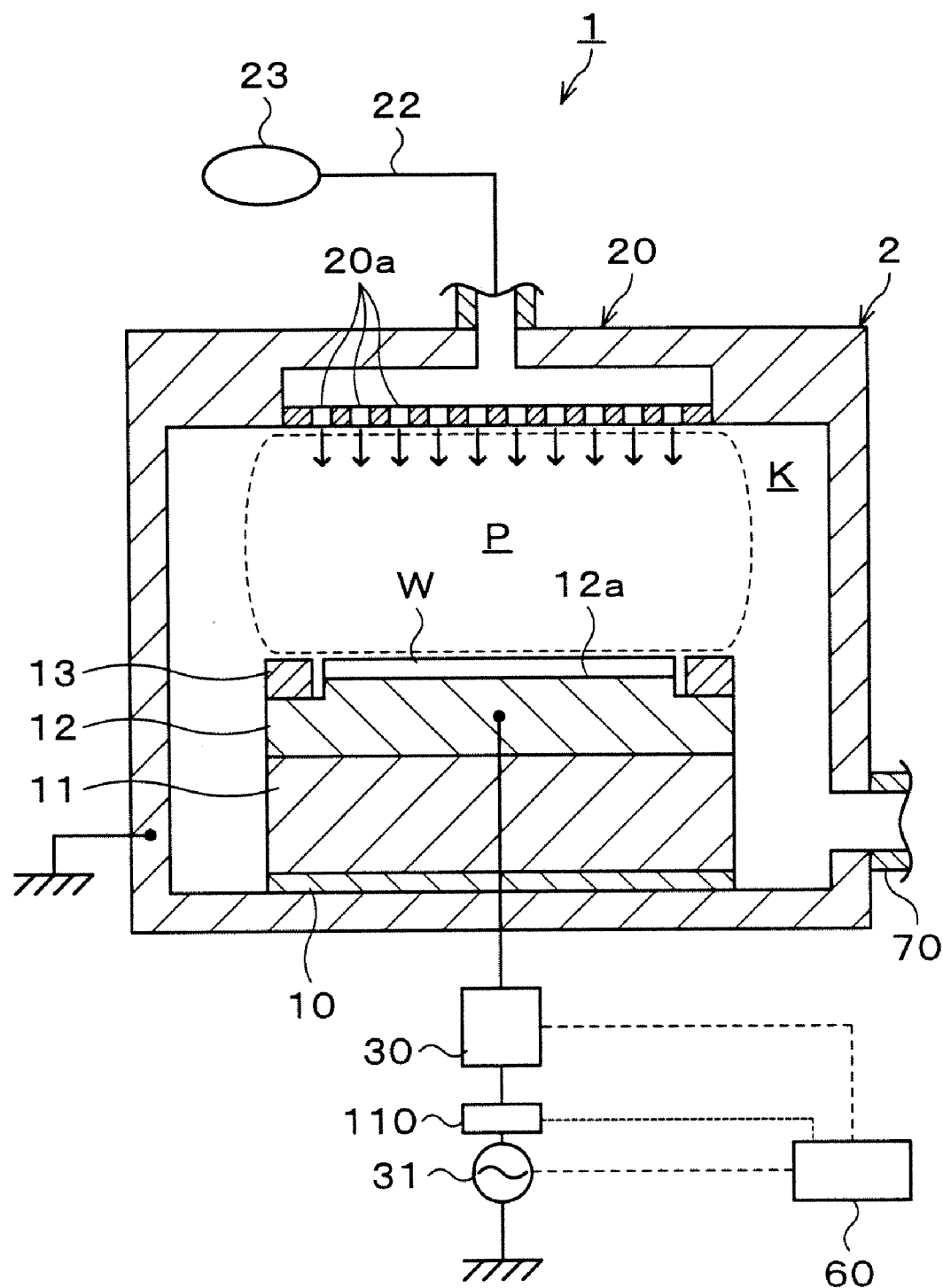
FIG. 9 is an explanatory view roughly showing the structure of a plasma etching apparatus in which a detecting part is provided on an output side of a radio-frequency power source.
Figure 10:
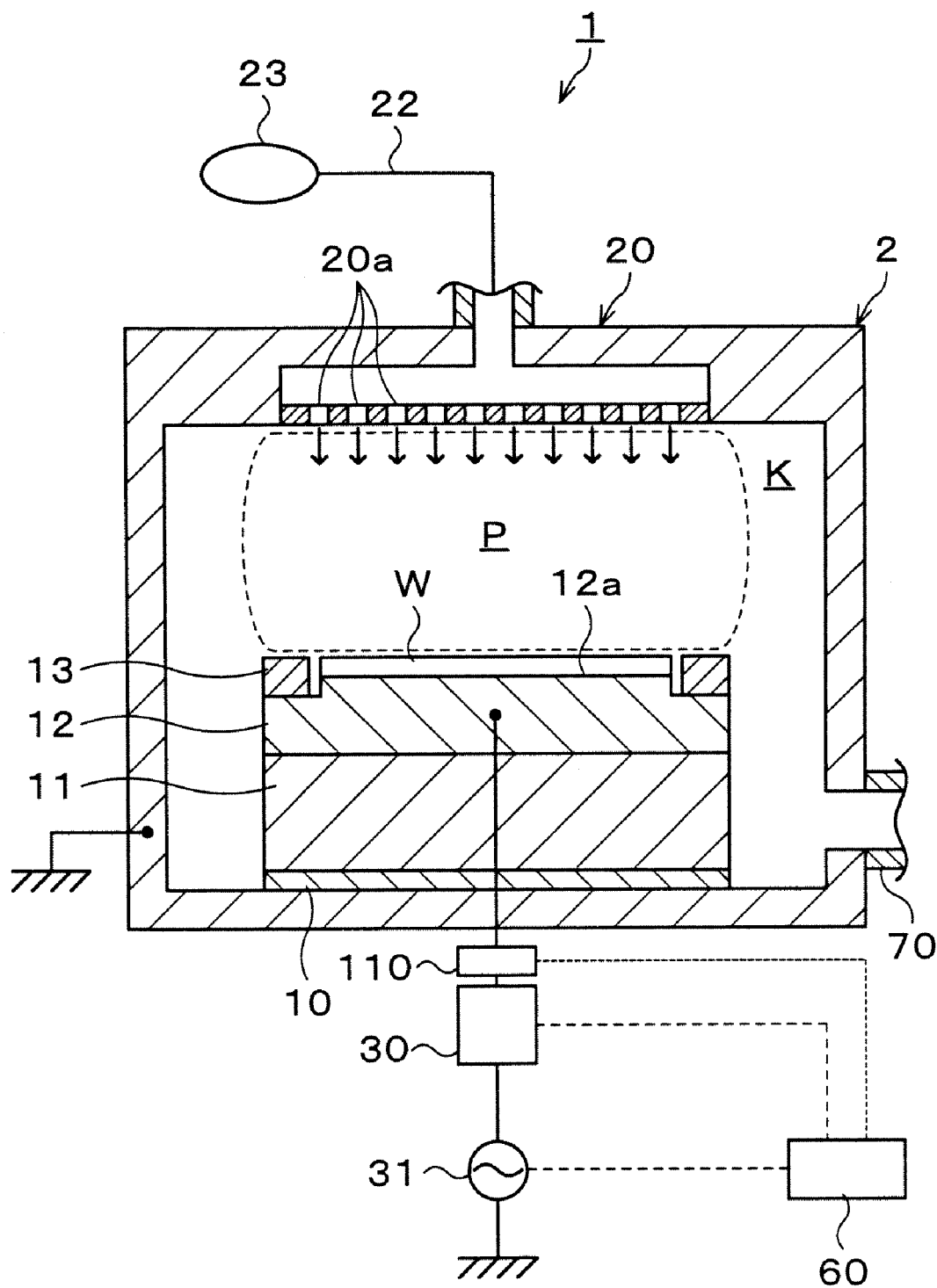
FIG. 10 is an explanatory view roughly showing the structure of a plasma etching apparatus in which a detecting part is provided on an output side of a matching unit.

In the above-described example, the detecting part detecting the radio-frequency current amount is not limited to the probe 40, but may be a current sensor detecting a current value in a circuit. In such a case, for example, a current sensor 110 may be provided on an output side of the radio-frequency power source 31 as shown in FIG. 9, or may be provided on an output side of the matching unit 30 as shown in FIG. 10.

Figure 11:
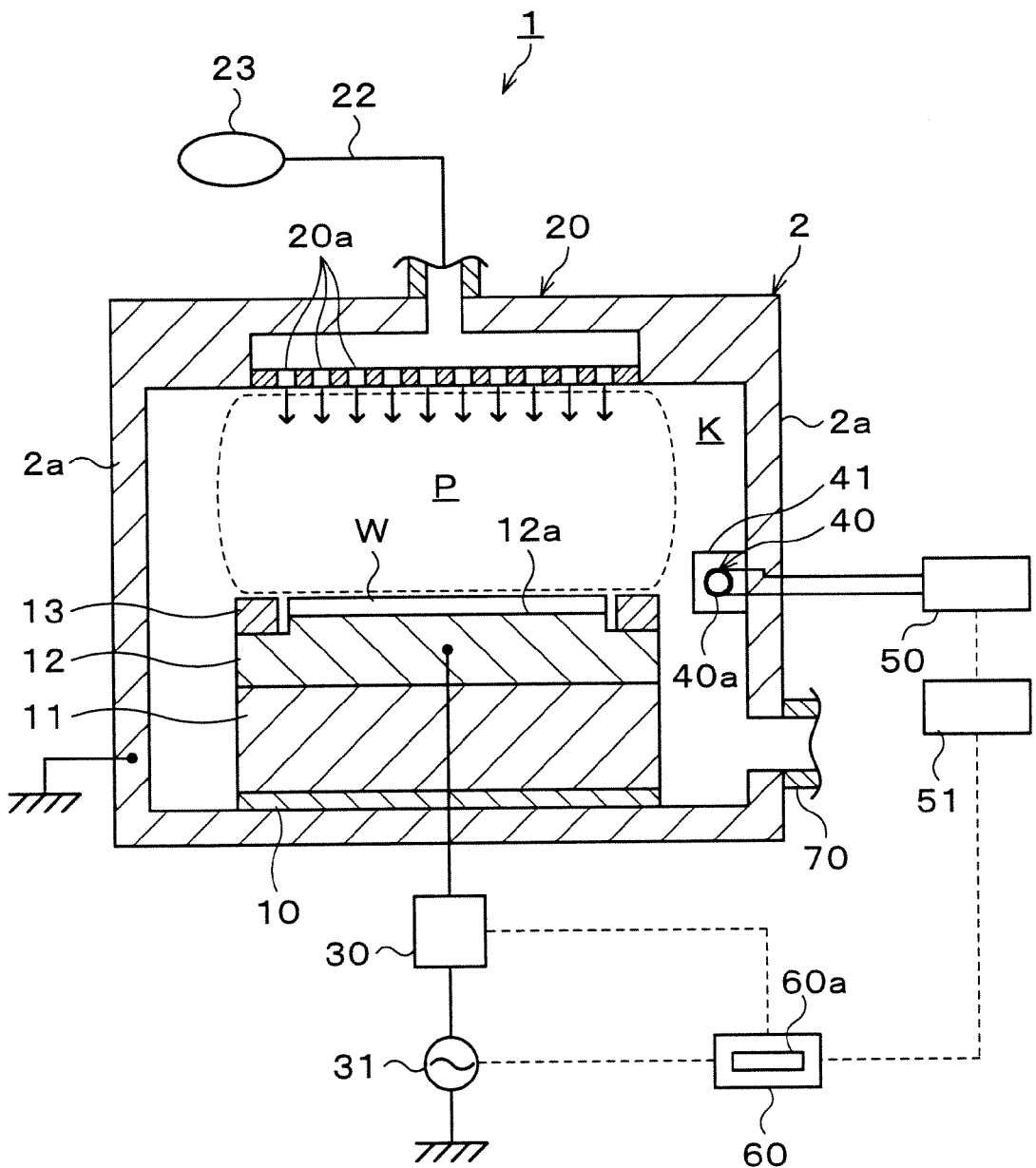
FIG. 11 is an explanatory view roughly showing the structure of a plasma etching apparatus in which a control part has a setting storage part.

In the above-described embodiment, for example, the control part 60 of the plasma etching apparatus 1 may include a setting storage part (recipe storage part) 60*a* storing in advance a plurality of set values based on which the plasma processing is performed, as shown in FIG. 11, and the setting storage part 60*a* may have a value of the radio-frequency current amount as the set value. In this case, since the value of the radio-frequency current amount is set as a parameter of the plasma processing, the plasma processing can be controlled so that the radio-frequency current amount has a desired value. As a result, in a case where, for example, the same processing is performed in a plurality of the same plasma processing apparatuses 1, the same processing result can be obtained in the apparatuses, and therefore, it is possible to reduce difference in the processing result among the apparatuses.

In the foregoing, the preferred embodiment of the present invention has been described with reference to the accompanying drawings, but the present invention is not limited to such examples. It is obvious that those skilled in the art could reach various kinds of modified examples and corrected examples within a scope of the spirit described in the claims, and it should be understood that these examples naturally belong to the technical scope of the present invention.

For example, the number of windings of the coil 40*a* of the probe 40 is not limited to two, but may be one or may be three or more. Further, the coil 40*a* is not limited to be in the circular shape but may be in a square shape. Further, in the above-described embodiment, the radio-frequency power is supplied to the lower electrode 12, but the radio-frequency power may be supplied to the upper electrode 20. Alternatively, the radio-frequency power may be supplied both to the lower electrode 12 and the upper electrode 20. In the above-described embodiment, the present invention is applied to the plasma etching apparatus 1, but the present invention is also applicable to a plasma processing apparatus for substrate processing other than the etching process, for example, a deposition process. Further, the substrate processed in the plasma processing apparatus of the present invention may be any of a semiconductor wafer, an organic EL substrate, a substrate for FPD (flat panel display), and the like.

What is claimed is:

1. A plasma processing apparatus which has upper and lower radio-frequency electrodes facing each other in a process vessel and processes a substrate by supplying radio-frequency power to at least one of the radio-frequency electrodes and generating plasma in the process vessel, the apparatus comprising:

a probe which is disposed in the process vessel to detect a time varying magnetic flux density directed in a azimuthal direction around an up/down-direction center axis of the process vessel, the probe being covered by an insulative cover; and a calculation part which calculates an amount of radio-frequency current passing in the plasma when the radio-frequency power is supplied, based on the time varying magnetic flux density detected by said probe.

2. The plasma processing apparatus according to claim 1, wherein said probe is formed in a coil shape, and an axis of the coil is directed in the azimuthal direction around the center axis of the process vessel, the probe detects an induced electromotive force generated in the coil, as the time varying magnetic flux density, and wherein said calculation part calculates the amount of the radio-frequency current from the induced electromotive force.

3. The plasma processing apparatus according to claim 1, wherein said probe is provided at a height between the upper and lower radio-frequency electrodes.

4. The plasma processing apparatus according to claim 1, wherein said probe is provided at a substantially same height as the substrate held on the lower radio-frequency electrode in the process vessel.

5. The plasma processing apparatus according to claim 1, wherein said probe is provided on an outer side of the substrate held on the lower radio-frequency electrode in the process vessel.

6. The plasma processing apparatus according to claim 5, wherein said probe is provided at a position apart from a sidewall portion of the process vessel by 15 mm to 25 mm.

7. The plasma processing apparatus according to claim 1, wherein said probe is movable up and down in the process vessel.

8. The plasma processing apparatus according to claim 1, further comprising:
a control part which executes the detection of the time varying magnetic flux density and the calculation of the amount of the radio-frequency current during the processing of the substrate, and stops the processing of the substrate based on the calculated amount of the radio-frequency current and a preset threshold value of the amount of the radio-frequency current.

9. The plasma processing apparatus according to claim 1, further comprising:
an adjustment part which adjusts an output of the radio-frequency power based on the calculated amount of the radio-frequency current.

10. The plasma processing apparatus according to claim 1, further comprising:
an analysis part which decomposes the detected time varying magnetic flux density into frequency components included in the detected time varying magnetic flux density.

11. The plasma processing apparatus according to claim 1, further comprising:
an analysis part which decomposes the detected time varying magnetic flux density into frequency components included in the detected time varying magnetic flux density.

12. The plasma processing apparatus according to claim 1, further comprising:
a control part controlling the radio-frequency power to make the amount of radio-frequency current calculated by said calculation part constant.

13. The plasma processing apparatus according to claim 12, further comprising:
a setting storage part storing in advance a plurality of set values for performing the plasma processing, said setting storage part having a value of the amount of radio-frequency current as the set value,
wherein said control part controls the radio-frequency power to make the amount of the radio-frequency current calculated by said calculation part equal to the set value and constant.

14. A plasma processing apparatus which has upper and lower radio-frequency electrodes facing each other in a process vessel and processes a substrate by supplying radio-frequency power to at least one of the radio-frequency electrodes and generating plasma in the process vessel, the apparatus comprising:
a probe which is disposed in the process vessel to detect a time varying magnetic flux density directed in a azimuthal direction around an up/down-direction center axis of the process vessel; and
a calculation part which calculates an amount of radio-frequency current passing in the plasma when the radio-frequency power is supplied, based on the time varying magnetic flux density detected by said probe,
wherein the probe is buried in a member facing the generated plasma.

15. The plasma processing apparatus according to claim 14,
wherein said probe is formed in a coil shape, and an axis of the coil is directed in the azimuthal direction around the center axis of the process vessel, the probe detects an induced electromotive force generated in the coil, as the time varying magnetic flux density, and
wherein said calculation part calculates the amount of the radio-frequency current from the induced electromotive force.

16. The plasma processing apparatus according to claim 14,
wherein said probe is buried in a wall portion of the process vessel.

17. The plasma processing apparatus according to claim 14,
wherein said probe is buried in an annular member surrounding an outer periphery of the substrate held on the lower radio-frequency electrodes in the process vessel.

18. The plasma processing apparatus according to claim 14, further comprising:
a control part which executes the detection of the time varying magnetic flux density and the calculation of the amount of the radio-frequency current during the processing of the substrate, and stops the processing of the substrate based on the calculated amount of the radio-frequency current and a preset threshold value of the amount of the radio-frequency current.

19. The plasma processing apparatus according to claim 14, further comprising:
an adjustment part which adjusts an output of the radio-frequency power based on the calculated amount of the radio-frequency current.

* * * * *